(12) United States Patent
Chaki et al.

US010130995B2

(10) Patent No.: US 10,130,995 B2
(45) Date of Patent: Nov. 20, 2018

(54) METHOD FOR MANUFACTURING METAL POWDER

(71) Applicant: Alpha Assembly Solutions Inc., Somerset, NJ (US)

(72) Inventors: Nirmalya Kumar Chaki, South Plainfield, NJ (US); Poulami Sengupta Roy, South Plainfield, NJ (US); Siuli Sarkar, South Plainfield, NJ (US); Sutapa Mukherjee, South Plainfield, NJ (US)

(73) Assignee: Alpha Assembly Solutions Inc., Somerset, NJ (US)

( * ) Notice: Subject to any disclaimer, the term of this patent is extended or adjusted under 35 U.S.C. 154(b) by 78 days.

(21) Appl. No.: 15/302,712

(22) PCT Filed: Apr. 10, 2015

(86) PCT No.: PCT/GB2015/051099
§ 371 (c)(1),
(2) Date: Oct. 7, 2016

(87) PCT Pub. No.: WO2015/162405
PCT Pub. Date: Oct. 29, 2015

(65) Prior Publication Data
US 2017/0028477 A1 Feb. 2, 2017

(30) Foreign Application Priority Data

Apr. 23, 2014 (IN) .......................... 1102/DEL/2014

(51) Int. Cl.
*B22F 9/24* (2006.01)
*B22F 1/00* (2006.01)
(Continued)

(52) U.S. Cl.
CPC .............. *B22F 9/24* (2013.01); *B22F 1/0014* (2013.01); *B22F 1/0074* (2013.01); *B22F 1/025* (2013.01); *B22F 9/04* (2013.01); *C09C 1/62* (2013.01); *C09C 1/622* (2013.01); *C09C 1/627* (2013.01); *C09J 1/00* (2013.01); *C09J 9/02* (2013.01); *C09J 11/04* (2013.01); *H01L 24/27* (2013.01); *H01L 24/29* (2013.01); *H01L 24/81* (2013.01); *H01L 24/83* (2013.01); *B22F 2009/043* (2013.01); *B22F 2301/10* (2013.01); *B22F 2301/255* (2013.01); *C01P 2004/20* (2013.01); *C01P 2004/32* (2013.01); *C01P 2004/51* (2013.01); *C01P 2004/61* (2013.01); *C01P 2006/11* (2013.01); *C01P 2006/12* (2013.01); *C01P 2006/80* (2013.01); *H01L 2224/111* (2013.01); *H01L 2224/1111* (2013.01); *H01L 2224/1131* (2013.01); *H01L 2224/1132* (2013.01); *H01L 2224/1144* (2013.01); *H01L 2224/11312* (2013.01); *H01L 2224/11438* (2013.01); *H01L 2224/11505* (2013.01); *H01L 2224/1339* (2013.01); *H01L 2224/1349* (2013.01); *H01L 2224/13294* (2013.01); *H01L 2224/13339* (2013.01); *H01L 2224/13344* (2013.01); *H01L 2224/13347* (2013.01); *H01L 2224/13355* (2013.01); *H01L 2224/13387* (2013.01); *H01L 2224/13439* (2013.01); *H01L 2224/13499* (2013.01); *H01L 2224/16145* (2013.01); *H01L 2224/16227* (2013.01); *H01L 2224/271* (2013.01); *H01L 2224/2711* (2013.01); *H01L 2224/2731* (2013.01); *H01L 2224/2732* (2013.01); *H01L 2224/2744* (2013.01); *H01L 2224/27312* (2013.01); *H01L 2224/27438* (2013.01); *H01L 2224/27505* (2013.01); *H01L 2224/29011* (2013.01); *H01L 2224/2939* (2013.01); *H01L 2224/2949* (2013.01); *H01L 2224/29139* (2013.01); *H01L 2224/29147* (2013.01); *H01L 2224/29294* (2013.01); *H01L 2224/29339* (2013.01); *H01L 2224/29344* (2013.01); *H01L 2224/29347* (2013.01); *H01L 2224/29355* (2013.01); *H01L 2224/29387* (2013.01); *H01L 2224/29439* (2013.01); *H01L 2224/29499* (2013.01); *H01L 2224/32145* (2013.01);
(Continued)

(58) Field of Classification Search
None
See application file for complete search history.

(56) References Cited

U.S. PATENT DOCUMENTS

| 2003/0089199 A1 | 5/2003 | Sano et al. |
| 2005/0188788 A1 | 9/2005 | Ogi et al. |
| 2011/0253949 A1* | 10/2011 | Kaneda ................ B22F 1/0014 252/514 |
| 2014/0339479 A1 | 11/2014 | Koike et al. |

(Continued)

FOREIGN PATENT DOCUMENTS

| CN | 101288133 A | 10/2008 |
| EP | 3134221 | 3/2017 |

(Continued)

OTHER PUBLICATIONS

Kim et al., Mechanical-dry coating of wax onto copper powder by ball milling, (2003) Material Science and Engineering A342, 258-263.*

*Primary Examiner* — Jenny R Wu
(74) *Attorney, Agent, or Firm* — Carmody Torrance Sandak & Hennessey LLP

(57) ABSTRACT

A method for manufacturing metal powder comprising:
providing a basic metal salt solution;
contacting the basic metal salt solution with a reducing agent to precipitate metal powder therefrom; and
recovering precipitated metal powder from the solvent.

12 Claims, 8 Drawing Sheets

(51) Int. Cl.
*B22F 1/02* (2006.01)
*C09C 1/62* (2006.01)
*B22F 9/04* (2006.01)
*C09J 1/00* (2006.01)
*C09J 9/02* (2006.01)
*C09J 11/04* (2006.01)
*H01L 23/00* (2006.01)

(52) U.S. Cl.
CPC .............. *H01L 2224/32227* (2013.01); *H01L 2224/8121* (2013.01); *H01L 2224/8184* (2013.01); *H01L 2224/81191* (2013.01); *H01L 2224/81192* (2013.01); *H01L 2224/81203* (2013.01); *H01L 2224/8321* (2013.01); *H01L 2224/8384* (2013.01); *H01L 2224/83191* (2013.01); *H01L 2224/83192* (2013.01); *H01L 2224/83203* (2013.01); *H01L 2224/94* (2013.01); *H01L 2924/12041* (2013.01)

(56) References Cited

U.S. PATENT DOCUMENTS

2015/0353804 A1* 12/2015 Ghosal .................. B82Y 30/00
419/8
2017/0028477 A1 2/2017 Setna et al.

FOREIGN PATENT DOCUMENTS

| JP | 11-096834 | 4/1999 |
| JP | 2009-242914 | 10/2009 |
| JP | 2011-111652 | 6/2011 |
| JP | 2013-149527 | 8/2013 |
| JP | 2013-196954 | 9/2013 |
| WO | 2008/059789 | 5/2008 |
| WO | 2014068299 | 5/2014 |
| WO | 2014084021 | 6/2014 |
| WO | 2015162405 | 10/2015 |

* cited by examiner

METHOD FOR MANUFACTURING METAL POWDER

The invention relates to a method for manufacturing a metal powder, and a metal powder manufactured according to the method.

Sintered joints provide an alternative to soldered joints. A typical method of forming a sintered joint involves placing a metal powder, often in the form of a powder compact, between two work pieces to be joined and then sintering the metal powder. The resulting atomic diffusion of the metal atoms forms a bond between the two work pieces.

Metal nanopowders have been used to form sintered joints in the electronics industry, and are considered to be useful alternatives to lead-free soldering. The differing behaviour between nanomaterials and the corresponding bulk material is thought to be due to nanomaterials having a higher surface-to-volume ratio.

Sintering powders containing silver nanoparticles are known. Sintered joints formed by atomic diffusion of silver nanoparticles can be processed at a temperature significantly lower than the melting temperature of the bulk and can also be used for high temperature applications. The potential advantages, such as high temperature stability, high electrical and thermal conductivity, and good mechanical properties, make such sintering powders promising candidates for die attachment applications. However, the sintering temperatures of such sintering powders are still too high for effective use in most electronics applications.

Sintering temperatures may be reduced by applying an external pressure during sintering. Pressure-assisted low-temperature sintering of silver paste has been shown to be a viable alternative to solder reflow as a die-attachment method. The application of high pressure has been shown to significantly lower the sintering temperature, and the desired properties for die attachment can be achieved at a relatively faster rate resulting in the formation of a sintered joint within a few minutes. However, a large external pressure makes automation of the process difficult. Furthermore, application of a large external pressure may result in damage to the work pieces.

It is known to dispense solder paste for a variety of applications, but mostly as an alternative when wave solder or screen printing is not possible. Solder paste can be dispensed on a variety of surface mount applications on printed circuit boards, integrated circuit packages, and electrical component connectors. Typical problems of solder paste include: dripping, skipped dots, and inconsistent dispensing. Soft and hard solders are typically used in the electronic industries for die attached and dispensing. The soft solders are susceptible to fatigue failure under thermal cycling conditions. On the other hand, hard solders and glass matrix composites are used to enable devices to run at higher junction temperatures, but their higher elastic moduli and processing temperatures can generate high mechanical stresses in devices, and these materials also have relatively low thermal and electrical conductivities.

The present invention seeks to tackle at least some of the problems associated with the prior art or at least to provide a commercially acceptable alternative solution thereto.

In a first aspect, the present invention provides a method for manufacturing metal powder comprising:
providing a basic metal salt solution;
contacting the basic metal salt solution with a reducing agent to precipitate metal powder therefrom; and
recovering precipitated metal powder from the solvent.

Each aspect or embodiment as defined herein may be combined with any other aspect(s) or embodiment(s) unless clearly indicated to the contrary. In particular, any features indicated as being preferred or advantageous may be combined with any other feature indicated as being preferred or advantageous.

The term "sintering powder" as used herein may encompass a powder capable of forming a sintered joint. Sintered joints are formed by atomic diffusion of metal particles placed between two work pieces to be joined. The term "sintering powder" may encompass a particulate. The sintering powder may comprise regular shaped particles (such as, for example, spheres) or irregular shaped particles (such as, for example, whiskers, plates, rods or flakes).

The term "capping agent" as used herein may encompass a species that, when present on the surface of metal particles, reduces agglomeration of the metal particles, enables particle size control during powder production and reduces particles' surface oxidation or other contamination.

The inventors have surprisingly found that the metal powder manufactured according to the method may exhibit a tap density of greater than 2 $g/cm^3$, typically greater than 3 $g/cm^3$, more typically from 3.5 to 5.5 $g/cm^3$. Lower tap densities may result in increased aggregation of the particles. Accordingly, the powder manufactured by the method described herein is easy to handle and may be used to form a fine line. Lower tap densities may result in an unfavourably non-compact and porous sintered joint. The tap density may be measured under the standard procedure using a tap density meter.

The metal powder is typically micron-sized, and may exhibit a size distribution providing particularly advantageous sintering properties. For example, the powder typically exhibits a D50 of from 500 nm to 10 μm. The D50 may be measured with a particle size analyser using either a dynamic light scattering method or laser scattering method. Advantageously, the majority of the particles forming the powder have a longest dimension of from 100 nm to 50 μm, preferably from 100 nm to 30 μm. Typically, substantially all of the particles forming the powder will have longest dimensions in these ranges. When the particles are spherical, the longest dimension will be the diameter of the sphere.

The combination of the size, size and shape distribution and tap density values exhibited by the metal powder may render the powder particularly effective for use as a sintering powder, for example in the manufacture of high density, low porosity sintered metal joint. Such a joint may extend the power and thermal cycling capabilities of modern power modules that are required for industrial and automotive applications.

The inventors have surprisingly found that the powder manufactured according to the method of the present invention may be sintered at relatively low temperatures with the application of only very low pressure, typically substantially no pressure. As a result, formation of a sintered joint between work pieces using the metal powder may occur with reduced damage to the work pieces. In addition, since the application of high pressure is not required, the formation of a sintered joint is simplified, and may be more easily automated. Furthermore, in contrast to nano-sized particles, agglomeration of the metal particles can be avoided by the use of only low amounts of capping agent. Accordingly, in contrast to sintering powders comprising nano-sized particles only, the amount of residual organics contained in a resulting sintered joint is reduced, thereby improving the mechanical properties of the joint.

The basic metal salt solution is typically aqueous and typically exhibits a pH of greater than 7, more typically greater than about 7.5, even more preferably about 8. The high pH may be provided by the presence of a metal-containing hydroxide such as, for example, sodium hydroxide. Alternatively, or in addition, the high pH may be provided by the presence of a tertiary organic base such as, for example, triethylamine.

A particularly suitable metal salt solution is a metal nitrate solution. Examples of metal nitrate solutions include, for example, silver nitrate solution and copper nitrate solution. The metal nitrate solution may comprise a surfactant such as, for example, DAXAD.

The metal particles forming the metal powder may all comprise the same metal. Alternatively, some of the particles may comprise different metals. In addition, individual particles may comprise two or more different metals. The term "metal" as used herein may encompass alloys or core-shell structures. Accordingly, the particles may comprise one or more alloys or core-shell structures of one or more metals.

The shape of particles making up the resulting metal powder by spherical, faceted, irregular, flake or combinations of two or more thereof.

The precipitated metal powder may be recovered from the solvent by, for example, filtration and/or decantation and/or centrifugation. The filtered and/or decanted and/or centrifuged metal powder may then be subjected to, for example, washing and/or drying.

The reducing agent preferably comprises one or more of hydrazine, formaldehyde and borohydride. Such reducing agents are particularly effective at providing the favourable size distributions and tap density values of the resulting metal powders. In this regard, a reducing agent comprising a combination of hydrazine and hydroxide is particularly preferred. This is surprising, since it is understood in the art that the use of hydrazine typically results in the formation of nano-sized particles. Without being bound by theory, it is considered that the presence of hydroxide in combination with hydrazine and in the (initial) absence of any capping agent in the reaction medium slows down the rate of the reaction and enhances the growth of larger particles by the Ostwald ripening process, thereby resulting in the formation of micron-sized particles having a favourable size distribution rather than nano-sized particles. It is further considered that the delayed addition of capping agent (see below) results in a favourable size distribution of aggregation of particles. Examples of suitable reducing agents include, for example, hydrazine hydrate, basic formalin solution and sodium borohydride.

Preferably, the method further comprises contacting the basic metal salt solution with a capping agent after contacting the basic metal salt solution with the reducing agent. In other words, the capping agent is preferably added after the reducing agent has been added to the solution but before the precipitated metal particles are recovered from the solvent. The capping agent may at least partially coat the surface of the particles forming the metal powder, and may therefore help to reduce uncontrolled agglomeration of the particles. Higher degree of uncontrolled agglomeration is unfavourable, since it may decrease the tap densities and will result in a non-compact and porous sintered joint. The use of a capping agent may help to avoid degradation of the metal such as, for example, damage caused by exposure of the metal to air. Furthermore, adding the capping agent after the addition of the reducing agent may help to result in the favourable particle size distribution and tap density values. The capping agent is preferably contacted with the solution at least 1 second after the reducing agent, more preferably at least 2 seconds after the reducing agent, even more preferably from 2 to 600 seconds, still even more preferably from 3 to 120 seconds. In a particularly preferred embodiment, the capping agent is contacted with the solution about 5 seconds after the reducing agent.

The capping agent may comprise, for example, a fatty acid, and ester, an amide, an amine, a surfactant and/or a polymer. The capping agent preferably comprises a fatty acid, more preferably one or more of lauric acid, palmitic acid, stearic acid, iso-stearic acid and oleic acid. Such capping agents are particularly effective at preventing aggregation of the metal particles forming the metal powder.

The method preferably further comprises milling the recovered precipitated metal powder. Such milling may result in an increase in the proportion of particles forming the metal powder having a flat or "flake-like" shape. For example, the powder may typically comprise at least 10% by volume of particles having a flake-like shape, more typically from 20 to 80% by volume. Increased milling times may increase the proportion and aspect ratio of flake-like particles. A powder with such a particle size distribution having a higher-proportion of flake-like particles may exhibit enhanced compactness in comparison to a powder comprising spheres, and may thereby exhibit more favourable sintering properties. Furthermore, a paste comprising such a powder may exhibit increased viscosity, and may therefore be easier to handle. In addition, the paste with such a powder shows enhanced wetting behaviour to the substrates and work pieces due to the presence of flake-like particles with the appropriate size, aspect ratio, distribution and tap densities compared to paste made with only spherical-like particles with lower tap densities. The enhancement of wetting is very important to form a strong bond between two work pieces, which results due to the atomic diffusion of the metal atoms during sintering. The combination of the flake shape with the tap densities, size and aspect ratio distributions described herein result in a metal powder that exhibits particularly favourable sintering characteristics.

The milling is preferably carried out using a ball mill. The use of a ball mill is particularly effective at increasing the proportion of flake-like particles while retaining the favourable size distribution and tap density values. An attritor ball mill using zirconia beads is an example of a suitable ball mill. Preferable bead diameters include, for example, from 0.05 mm to 2 mm, preferably about 0.1 mm.

The milling is preferably carried out in the presence of a fatty acid, preferably one or more of lauric acid, palmitic acid, stearic acid, iso-stearic acid and oleic acid; and/or in the presence of a polymer, preferably PEG 400; and/or in the presence of a polyamine, preferably triethylenetetramine. These species may serve as a capping agent during the milling, thereby serving to reduce the aggregation and/or oxidation of the powder during milling and prior to use.

The milling is preferably carried out for at least 30 minutes, preferably at least 90 minutes. Increased milling times may increase the proportion of particles having a flake-like shape.

The metal preferably comprises one or more of silver, copper and alloys of one or more thereof. Such metals exhibit high electrical and thermal conductivity, and are therefore particularly advantageous when the powder is used in electronics applications, such as die attachment and microelectronic packaging. Suitable silver alloys include, for example, AgSn, AgPd, AuAg, AgCu and AgNi. The metal particles may comprise core-shell structures of silver coated particles such as, for example, silver coated copper, silver coated nickel, silver coated CuNi, silver coated CuNiZn and silver coated BN.

When the particles comprise silver, the powder may advantageously exhibit the following size distribution: a D90 of from 3 to 6 µm, preferably from 4 to 5.5 µm; and/or a D50 of from 0.9 to 2 µm, preferably from 1 to 1.8 µm; and/or a D10 of from 0.3 to 0.8 µm, preferably from 0.5 to 0.75 µm. When the particles comprise copper, the powder may advantageously exhibit the following size distribution: a D90 of from 4 to 15 µm, preferably from 10 to 13 µm; and/or a D50 of from 2 to 10 µm, preferably from 4 to 6 µm; and/or a D10 of from 0.5 to 3 µm, preferably from 1.5 to 2.5 µm. In combination with the favourable tap density values, this may enable the powders to be used in the manufacture of a high density and low porosity sintered joint. The copper particles may be faceted.

In a particularly preferred embodiment,
the metal comprises silver; and
the reducing agent comprises hydrazine,
the method further comprises:
  contacting the basic metal salt solution with an oleic acid capping agent after contacting the basic metal salt solution with the reducing agent; and
  milling the recovered precipitated metal powder for at least 30 minutes in the presence of an oleic acid capping agent using a ball mill.

The metal powder manufactured by such a method exhibits particularly favourable particle size distributions and tap density values, and may exhibit the favourable size distribution discussed above.

When the metal comprises copper, the method preferably further comprises applying a silver coating to the particles forming the powder. Such silver coated copper particles exhibit the high electrical and thermal conductivity of silver particles, with the relatively low cost of copper particles. The silver coated copper particles preferably exhibit the following size distribution: a D90 of from 4 to 13 µm, preferably from 9 to 12 µm; and/or a D50 of from 1 to 10 µm, preferably from 4 to 5.5 µm; and/or a D10 of from 0.5 to 3 µm, preferably from 2 to 2.8 µm.

Applying the silver coating preferably comprises:
etching an oxide layer from the copper particles; and
applying a silver coating to the copper particles using galvanic plating.

Such a method is particularly effective at coating the copper particles. In one embodiment, the etching is carried out using a polyamine, such as, for example, triethylenetetramine, and the galvanic plating is carried out in the presence of water soluble silver salt dissolved in deionised water and citric acid. In an alternative embodiment, a two-step etching is carried out using a combination of ammonium sulphate and ammonium hydroxide followed by treatment with a polyamine such as, for example, triethylenetetramine.

The method preferably further comprises applying a fatty acid coating to the silver coated particles. The fatty acid coating functions as a capping agent, and may thereby serve to reduce agglomeration and/or oxidation of the metal particles forming the metal powder.

In a further aspect, the present invention provides a method of manufacturing a copper powder comprising:
  providing a copper powder; and
  milling the copper powder using a ball mill in the presence of a polymer and/or a polyamine.

The resulting copper powder may predominantly comprise particles exhibiting a "flake-like" shape. The resulting powder may exhibit a D50 value of from 500 nm to 10 µm and/or a tap density of greater than 2 g/cm$^3$. The polymer may comprise, for example, PEG 400 and/or a polyamine such as, for example, triethylenetriamine.

In a further aspect, the present invention provides a metal powder manufactured according to the method described herein.

In a further aspect, the present invention provides a metal powder having:
  a D50 of from 500 nm to 10 µm; and
  a tap density of greater than 2/g/cm$^3$,
  wherein the metal powder comprises one or more of silver, copper and alloys of one or more thereof.

The combination of the size distribution and tap density values exhibited by the metal powder may render the powder particularly effective for use as a sintering powder, for example in the manufacture of high density, low porosity sintered metal joint.

The metal powder may advantageously have low levels of organics, for example less than 5 wt. % organics, preferably less than 3 wt. % organics, more preferably less than 1 wt. % organics, still more preferably less than 0.5 wt. % organics. (The term wt. % organics used herein refers to the wt. % of carbon measured by thermal or chemical analysis.)

The metal powder may advantageously exhibit low specific surface area (BET), for example less than 1.5 m$^2$/g, preferably less than 1 m$^2$/g, more preferably less than 0.8 m$^2$/g.

In a further aspect, the present invention provides a sintered joint formed using the metal powder as described herein. Such a sintered joint may exhibit particularly high strength and/or particularly high electrical and thermal conductivity. Furthermore, the sintered joint may exhibit very little change in shear strength following thermal shock, typically substantially no change in shear strength.

In a further aspect, the present invention provides an LED (light-emitting diode), MEMS (microelectromechanical system), OLED (organic light-emitting diode), PV cell (photovoltaic cell), power electronics, or printed electronics on polymers or other flexible or formable substrates comprising the sintered joint described herein.

In a further aspect the present invention provides a sintering paste comprising:
  the metal powder as described herein;
  a binder;
  a solvent; and
  optionally a rheology modifier and/or an organosilver compound and/or an activator and/or a surfactant and/or wetting agent and/or hydrogen peroxide or organic peroxides.

The paste may be printable and/or dispensable and/or jettable and/or pin transferable. The paste may have viscosity and flow characteristics particularly favourable for dispensing, meaning that the paste may be used as a one-to-one replacement for solders.

Compared to sintering pastes known in the art, the sintering paste of the present invention exhibits high stability at room temperature. This means that low temperature storage of the sintering paste is not required. This is a particularly important advantage of the sintering paste of the present invention.

The binder and/or solvent are typically selected so that they are able to be removed from the paste (for example by evaporation and/or burn out) at a temperature below the targeted sintering temperature of the sintering powder. This may help to promote near complete sintering of the metal particles. When organic material remains in the joint during sintering, inadequate sintering of the metal particles may occur. This may result in a weak sintered joint.

The binder may serve to bind the paste together so that it is easier to handle and position accurately in the location of a desired sintered joint. Examples of suitable binders include, but are not restricted to, thermoplastic polymers, such as, for example, poly(methyl methacrylate), polyamides, polyethylene, polypropylene, polystyrene; or thermosetting polymers, such as, for example, polyurethanes, polycyanurates, epoxy resin, polyimides, melamine resin and bismaleimide resin. Particularly preferred examples include hydroxypropylmethylcellulose, triacetin and polyvinyl acetate. Preferably the binder comprises an epoxy-based resin. Epoxy-based resin may be particularly effective at binding the paste together so that the paste is easier to handle and may be easier to position accurately in the location of a desired sintered joint. Furthermore, the use of epoxy resin may result in the formation of a stronger joint prior to sintering, meaning that there is no requirement to hold together the work pieces to be joined prior to sintering. The use of epoxy resin is particularly advantageous when the capping agent comprises an amine functional group. In this case, the amine acts as a hardener forming a cross-linked structure. This may result in a particularly strong joint prior to sintering.

The solvent preferably comprises a monoterpene alcohol and/or a glycol and/or glycol ether, preferably terpineol and/or diethylene glycol mono-n-butyl ether. Monoterpene alcohol and/or a glycol ether may be particularly effective at dispersing the metal particles within the paste, resulting in a homogeneous distribution of metal particles in the matrix of organic components with reduced cluster aggregation and/or agglomeration. The use of monoterpene alcohol and/or a glycol ether may serve to increase the flow-ability and printer-ability of the sintering paste.

A rheology modifier may be added to control the viscosity of the paste. Examples of suitable rheology modifiers include, but are not restricted to, short or long chain (C=2 to 30) carboxylic acids or di-carboxylic acids or hydroxyl carboxylic acids, for example lauric acid, stearic acid, neodecanoic acid, stearic acid, oleic acid, oxalic acid, malonic acid, succinic acid, adipic acid, maleic acid, citric acid, lactic acid or short or long chain (C=2 to 30) amines, for example, butyl amine, hexyl amine, octyl amine, dodecyl amine, hexadecyl amine, Thixcin R and Crayvallac Super, or combinations of two or more thereof.

During sintering, the organosilver compound may break down to metallic silver, which may increase the thermal conductivity of the sintered joint. In addition, the presence of the organosilver compound increases the wetting of the paste to the joint interface. The organosilver compound may comprise one or more of short or long chain carboxylic acids (C=1 to 30), such as, for example, silver stearate, silver palmitate, silver oleate, silver laurate, silver neodecanoate, silver decanoate, silver octanoate, silver hexanoate, silver lactate, silver oxalate, silver citrate, silver acetate and silver succinate. In some embodiments, the organosilver compound may be omitted.

An activator may be added to remove any metal oxide that may be present from the surface being printed and/or to remove any oxides that may be present in the sintering powder. Aryl or alkyl carboxylic acids may be used as activators, such as, for example, one or more of adipic acid, succinic acid and glutaric acid.

A surfactant may be added to the sintering paste to help disperse the sintering powder in the sintering paste. Examples of suitable surfactants include, but are not restricted to, Disperbyk 163, IGEPAL CA-630, lauryl glucoside and TritonX 100.

The sintering paste preferably further comprises a peroxide. Examples of suitable peroxides include, but are not restricted to, hydrogen peroxide or organic peroxides, such as, for example, tertiary-butyl hydroperoxide and tertiary-butyl peroxy-2-ethylhexanoate. Peroxide introduces oxygen into the paste, which may aid sintering of the paste beneath the die area in a die attach method. The oxygen may also enable sintering of the metal particles under an inert atmosphere, such as, for example, a nitrogen atmosphere. The sintering paste preferably comprises up to 3 wt. % hydrogen peroxide or organic peroxides, preferably from 0.5 to 2 wt. % hydrogen peroxide or organic peroxides, more preferably from 0.7 to 1.8 wt. % hydrogen peroxide or organic peroxides. Liquid peroxides are preferred to control rheology and silver settling.

The sintering paste preferably comprises:
from 1 to 15 wt. % binder; and/or
from 1 to 30 wt. % solvent; and/or
up to 5 wt. % rheology modifier; and/or
up to 10 wt. % an organosilver compound; and/or
up to 2 wt. % activator; and/or
up to 6 wt. % surfactant; and/or
up to 2 wt. % hydrogen peroxide or organic peroxides.

Binder and/or solvent contents within these ranges may help to provide the sintering paste with particularly desirable flow-ability and printer-ability. Preferably the sintering paste comprises from 2 to 8 wt., binder. In one embodiment the sintering paste comprises about 4.5 wt. % binder.

Preferably the sintering paste comprises from 5 to 30 wt. %, solvent. In one embodiment the sintering paste comprises about 26 wt. % solvent. The sintering paste may comprise 0 to 5 wt. % rheology modifier and/or 0 to 2 wt. % activator and/or 0 to 6 wt. % surfactant and/or 0 to 2 hydrogen peroxide or organic peroxides. The sintering paste may comprise from 62 to 90 wt. % sintering powder. The sintering powder may form the balance of the sintering paste.

In a further aspect the present invention provides a sintering paste comprising:
the metal powder as described herein;
an organosilver compound;
a solvent; and
optionally an activator and/or rheology modifier and/or surfactant and/or hydrogen peroxide or organic peroxides.

During sintering, the organosilver compound may break down to metallic silver, which may increase the thermal conductivity of the sintered joint. In addition, the presence of the organosilver compound increases the wetting of the paste to the joint interface. The organosilver compound may comprise one or more of short or long chain carboxylic acids (C=1 to 30), such as, for example, silver stearate, silver palmitate, silver oleate, silver laurate, silver neodecanoate, silver decanoate, silver octanoate, silver hexanoate, silver lactate, silver oxalate, silver citrate, silver acetate and silver succinate. In some embodiments, the organosilver compound may be omitted.

The sintering paste preferably further comprises a fatty acid and/or wetting agent, preferably one or more of: short or long chain (C=2 to 30) carboxylic acids or di-carboxylic acids or hydroxyl carboxylic acids, more preferably lauric acid, stearic acid, neodecanoic acid, stearic acid, oleic acid, oxalic acid, malonic acid, succinic acid, adipic acid, maleic acid, citric acid or lactic acid; or short or long chain (C=2 to 30) amines, more preferably butyl amine, hexyl amine, octyl amine, dodecyl amine or hexadecyl amine; or surfactants, more preferably triton X100, IGEPAL CA-630 or lauryl glucoside. The presence of fatty acids helps to bind the paste together. In other words, the presence of a fatty acid avoids the need for a separate binder, such as the epoxy based resin binder discussed above. Accordingly, the total amount of organics in the paste is less, resulting in a stronger final joint.

The sintering paste preferably further comprises a peroxide. Examples of suitable peroxides include, but are not restricted to, hydrogen peroxide or organic peroxides, such as, for example, tertiary-butyl hydroperoxide and tertiary-butyl peroxy-2-ethylhexanoate. Peroxide introduces oxygen into the paste, which may aid sintering of the paste beneath the die area in a die attach method. The oxygen may also enable sintering of the metal particles under an inert atmosphere, such as, for example, a nitrogen atmosphere. The sintering paste preferably comprises up to 3 wt. % hydrogen peroxide or organic peroxides, preferably from 0.5 to 2 wt. % hydrogen peroxide or organic peroxides, more preferably from 0.7 to 1.8 wt. % hydrogen peroxide or organic peroxides. Liquid peroxides are preferred to control rheology and silver settling.

The sintering paste may comprise a film forming agent such as, for example, a polyamide, polyisobutylene, polyamide wax rheology modifier and castor oil based thixotropes.

Preferably the sintering paste is substantially resin free, more preferably completely resin free. The presence of resin may reduce the thermal and electrical conductance of the silver. The solvent preferably comprises a monoterpene alcohol and/or a glycol and/or glycol ether, more preferably a terpineol and/or diethylene glycol mono-n-butyl ether.

The sintering paste preferably comprises:
from 1 to 30 wt. % solvent; and/or
up to 50 wt. % organosilver compound, preferably from 0.1 to 25 wt. %, more preferably from 0.1 to 10 wt. %, even more preferably from 0.1 to 9 wt. %; and/or
up to 5 wt. % rheology modifier; and/or
up to 2 wt. % activator; and/or
up to 6 wt. % surfactant; and/or
up to 2 wt. % hydrogen peroxide or organic peroxides.

The sintering paste may comprise 0 to 5 wt. % rheology modifier and/or 0 to 2 wt. % activator and/or 0 to 6 wt. % surfactant and/or 0 to 2 hydrogen peroxide or organic peroxides. The sintering powder may form the balance of the sintering paste.

In a further aspect the present invention provides a sintering film comprising the metal powder as described herein and a binder. The film may be applied at the wafer level, die level, package/substrate level, and/or module level. Such a film may be obtained, for example, by printing the sintering paste as described herein onto a polyester sheet, heating the paste to at least partially remove the solvent and form a film, and then removing the film from the polyester sheet. The film as described herein is especially advantageous since it can be transferred on the die by simply pressing the die on to the film at slightly elevated temperature. Transferred film is an alternate application method, beneficially offered in certain situations. The film may be formed on a polymeric, glass, metal or ceramic substrate or directly on a wafer. The film may be on a polymeric substrate comprising polyester. The film may be formed on a polymeric substrate, wherein the polymeric substrate comprises a release coating. The film may be produced by applying the paste compositions by printing or casting of the material. The film may be produced by printing in a continuous layer. Alternatively, the film may be produced by printing to form an array of discrete shapes.

In a further aspect the present invention provides a method of die attachment comprising:
(i) placing the sintering film described herein between a die and a substrate to be joined; and
(ii) sintering the sintering film,
wherein the sintering is carried out without the application of pressure.

This "low pressure" or "pressureless" sintering is particularly advantageous, since it may make automation of the process simpler. Furthermore, damage to the work pieces may be reduced. Further advantages over methods employing pressured sintering include: shorter time required for die-placement (high UPH), low-pressure requirement for placement (highly advantageous for processing thin wafers), compatibility with commercial die-bonder and sintering in external heating equipment (batch process to improve UPH).

The sintering is preferably carried out at a temperature of from 150 to 400° C. for up to 120 minutes. Such conditions may result in particularly effective sintering of the sintering film while avoiding damage to the work pieces.

Step (i) preferably comprises:
(a) applying the sintering film to the die to form an assembly having a die side and a sintering film side; and
(b) contacting the film side of the assembly with the substrate.

Such a step may make automation of the process simpler, and may be carried out, for example, by the use of a stamp.

Step (a) is preferably carried out at a temperature of from 15 to 400° C. and a pressure of from 0.1 to 5 MPa for from 0.1 to 60 seconds. Such conditions may result in particularly effective application of the sintering film while avoiding damage to the die.

Step (b) is preferably carried out at a temperature of from 15 to 400° C. and a pressure of from 0.1 to 40 MPa for from 0.1 to 60 minutes. Such conditions may result in particularly effective contacting of the die to the substrate while avoiding damage to the die or substrate.

In a further aspect, the present invention provides a method of die attachment comprising:
(i) placing the sintering film described herein between a die and a substrate to be joined; and
(ii) sintering the sintering film,
wherein the sintering is carried out while applying a pressure of from 0.1 to 40 MPa.

In a further aspect, the present invention provides a method of wafer bonding comprising:
(i) placing the sintering film described herein between two or more wafers to be joined; and
(ii) sintering the sintering film,
wherein the sintering is carried out without the application of pressure.

In a further aspect, the present invention provides a method of transferring a sintering film to a component, comprising:
applying the sintering film described herein to a substrate to form an assembly having a sintering film side and a substrate side;
contacting the sintering film side of the assembly with a component;
heating the assembly to a temperature of from 50 to 200° C.;
applying a pressure of from 1 to 5 MPa to the assembly for from 0.1 seconds to 60 minutes; and
separating the substrate from the sintering film.

The substrate may be polymeric. The sintering film may be substantially the same size as the component. The component may be an LED.

In a further aspect the present invention provides a method for die-attachment attachment, comprising: applying the sintering film described herein to a substrate; placing a die on the film to form an assembly; applying a pressure of less than 5 MPa to the assembly; and sintering the assembly at a temperature of 100 to 400° C. for 0.1 s to 60 minutes, applying a pressure of less than 40 MPa. The same assembly may be further sintered at a temperature of 175 to 400° C. in a pressureless manner using variety of processes and equipment that provide appropriate degree of heat to initiate and complete sintering.

In a further aspect the present invention provides a method for die-attachment attachment, comprising: applying the sintering film described herein on a back side of a wafer; dicing the wafer to form a plurality of die; placing at least one die on a substrate to form an assembly; applying a pressure of more than 1 MPa to the assembly; and sintering the assembly at a temperature of 100 to 400° C. for 0.1 s to 60 minutes, applying a pressure of less than 40 MPa. The same assembly may be further sintered at a temperature of 175 to 400° C. in a pressureless manner using variety of processes and equipment that provide appropriate degree of heat to initiate and complete sintering.

In a further aspect the present invention provides a method for wafer bonding, comprising: applying the sintering film described herein on a back side of a wafer; placing one more same or different types of wafer on the sinterable Ag film containing wafer to form an assembly; applying a pressure of more than >0.1 MPa to the assembly; and sintering the assembly at a temperature of 100 400° C. for 0.25 s to 120 minutes. The same assembly may be further sintered at a temperature of 175 to 400° C. in a pressureless manner using variety of processes and equipment that provide appropriate degree of heat to initiate and complete sintering.

In a further aspect the present invention provides a method for wafer bonding, comprising: applying the sintering film on a back side of a wafer; placing one more same or different types of wafer on the sintering film containing wafer to form an assembly; applying a pressure of less than 40 MPa to the assembly; and sintering the assembly at a temperature of 100 to 400° C. for 0.25 s to 120 minutes. The same assembly may be further sintered at a temperature of 175 to 400° C. in a pressureless manner using variety of processes and equipment that provide appropriate degree of heat to initiate and complete sintering.

In a further aspect the present invention provides the use of the metal powder as described herein or the sintering paste or film as described herein in a method selected from: die attachment (e.g. chip-to-board, chip-to-substrate, chip-to-heat sink, chip-to-fixture), wafer-to-wafer bonding (e.g. chip-to-heat sink), reflective layer printing, hermetic and near hermetic sealing (for example for packages and perimeter seals), the production of interconnect lines (for example circuitry, pads), via filling in semiconductor devices and substrates, and flip-chip and wafer bumping.

In a further aspect the present invention provides a method of manufacturing a sintered joint comprising the steps:
   providing the metal powder as described herein or the sintering paste or film as described herein in the vicinity of two or more work pieces to be joined; and
   heating the metal powder or sintering paste or film to at least partially sinter the metal.

Advantageously, the heating step may be carried out at atmospheric pressure. The metal powder or sintering paste or film may be placed in the vicinity of the work piece under low pressure (typically 1-5 MPa for 0.1 to 60 seconds at a temperature of about 175 to 250° C.).

The heating step is preferably carried out at a temperature of at least 140° C., more preferably from 150 to 350° C., even more preferably from 160 to 300° C. Temperatures lower than 140° C. may not result in adequate sintering of the particles in the sintering powder and/or may not result in adequate removal of the organics by evaporation and/or burn out. Temperatures higher than 350° C. may result in damage to the work pieces.

In a further aspect the present invention provides a method of manufacturing a sintering paste comprising:
   preparing a metal powder according to the method described herein; and
   combining the metal powder with a binder, a solvent, and optionally a rheology modifier and/or an organosilver compound and/or and activator and/or a peroxide.

As will be appreciated, the method, powder, paste and film disclosed herein are associated with a number of benefits over prior art techniques. In particular, there is no slump phenomena, no bridges, no bubbles in print deposit, no bleed-out and no aperture blocking when printing with the paste. Moreover, it is possible to provide a paste height of from 80-90 micrometers with flat deposits, no Dog—ears and no undulations. Thus, the benefits of the paste which includes a binder (e.g. resin) include:
   Pressure-less Sintering
   Process ability in standard SMT Line
   Flat and uniform surface topology
   Die Shear Strength average >15 MPa
   No interfacial failure mode
   Room Temp Stability=min 1 month
   Thermal Cycling: Acceptable joint strength up to 1000 cycles (−40 C to +125 C, 10 min dwell).
   Needle and Jet Dispensable
   Film Form Factor In addition to the benefits mentioned above, the paste containing organosilver compound has some further benefits which are listed below:
   High die shear strength (15 to 45 MPa)
   High thermal conductivity (>100 W/mK)
   Pin transferable
   Good high thermal properties The invention will now be described with reference to the following non-limiting Figures, in which:

Figure 1:
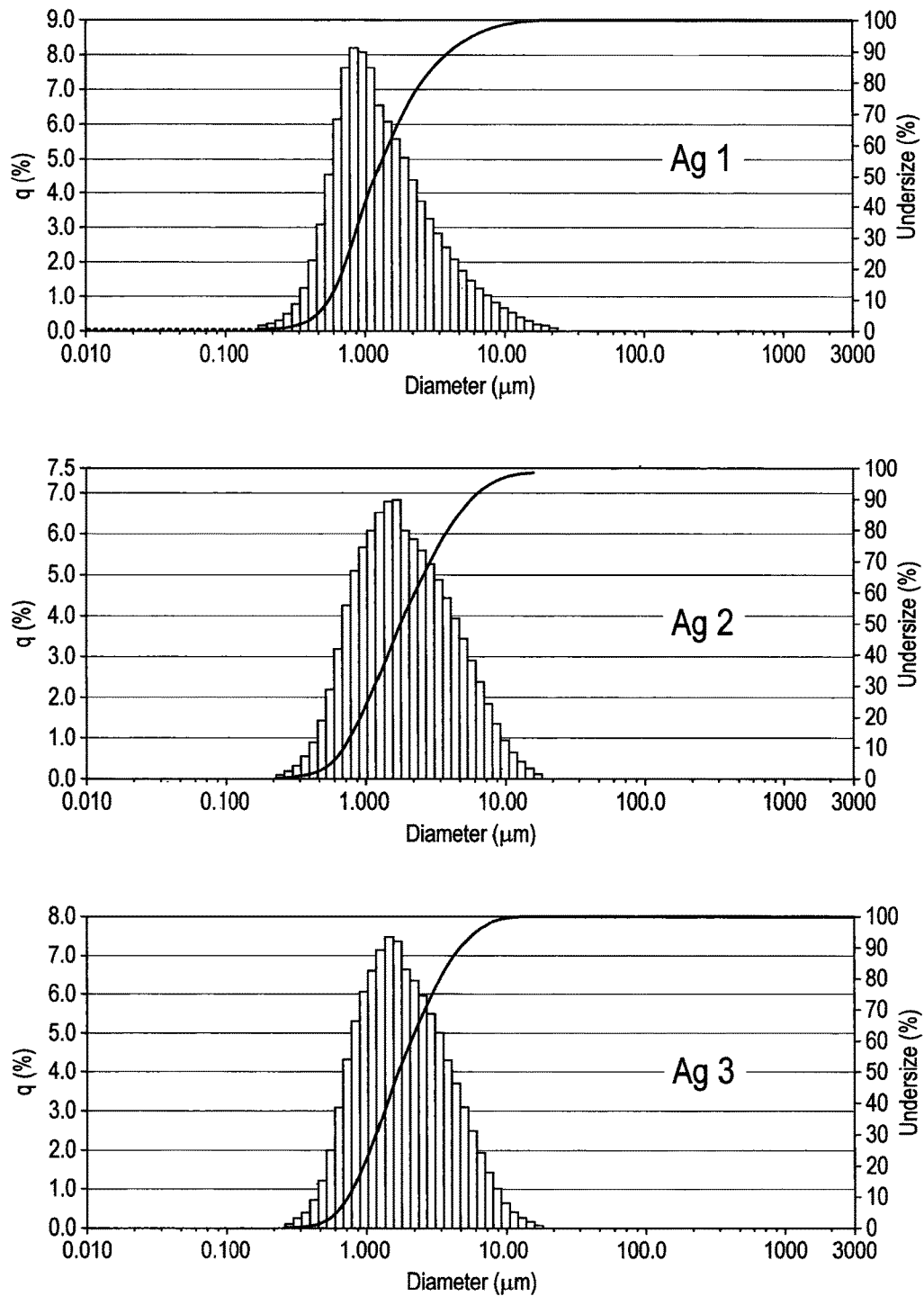
FIG. 1 shows particle size distribution (PSD) graphs of Ag particles of type Ag1-3.
Figure 2:
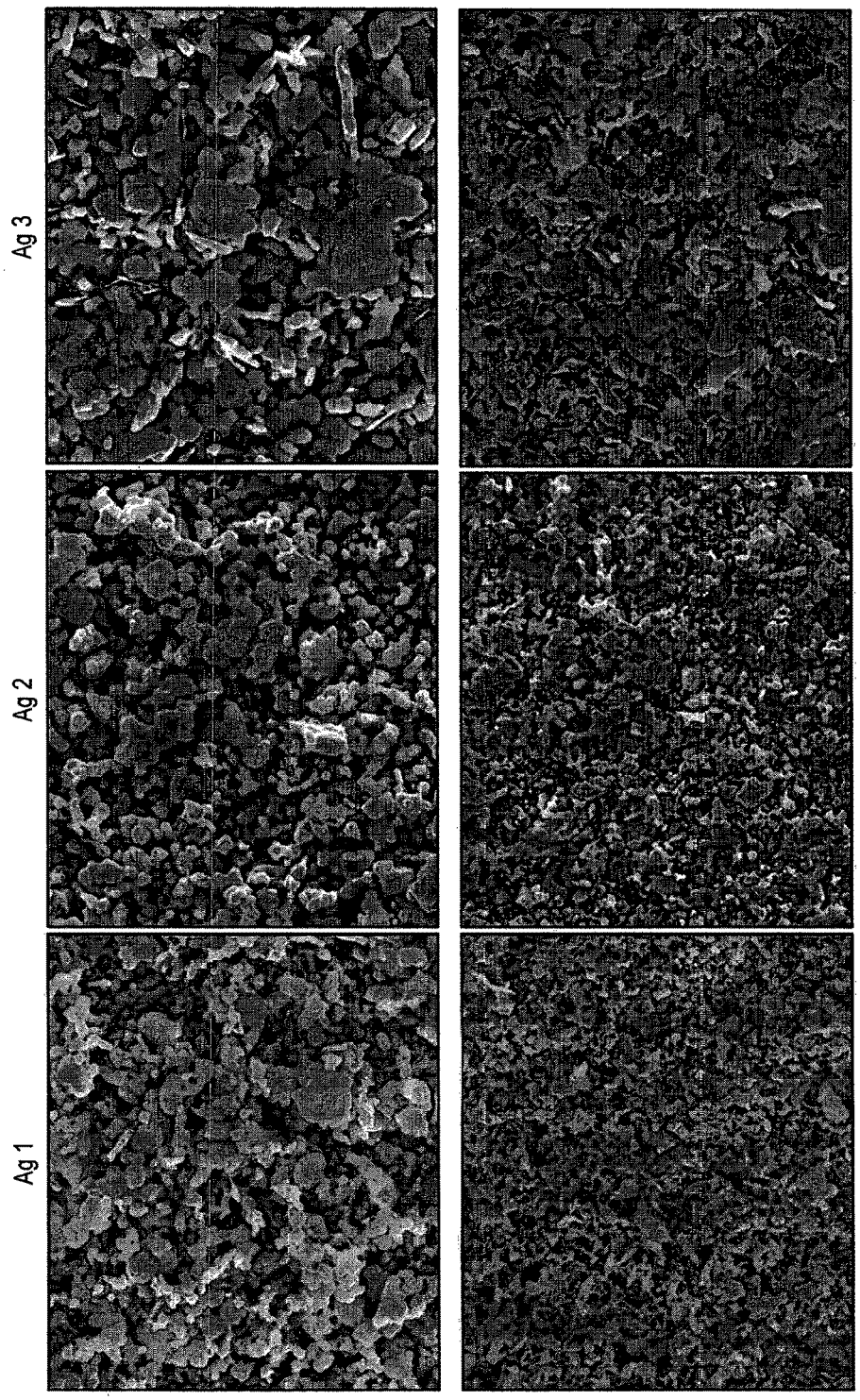
FIG. 2 shows scanning electron micrographs (SEM) of Ag particles of type Ag1-3.
Figure 3:
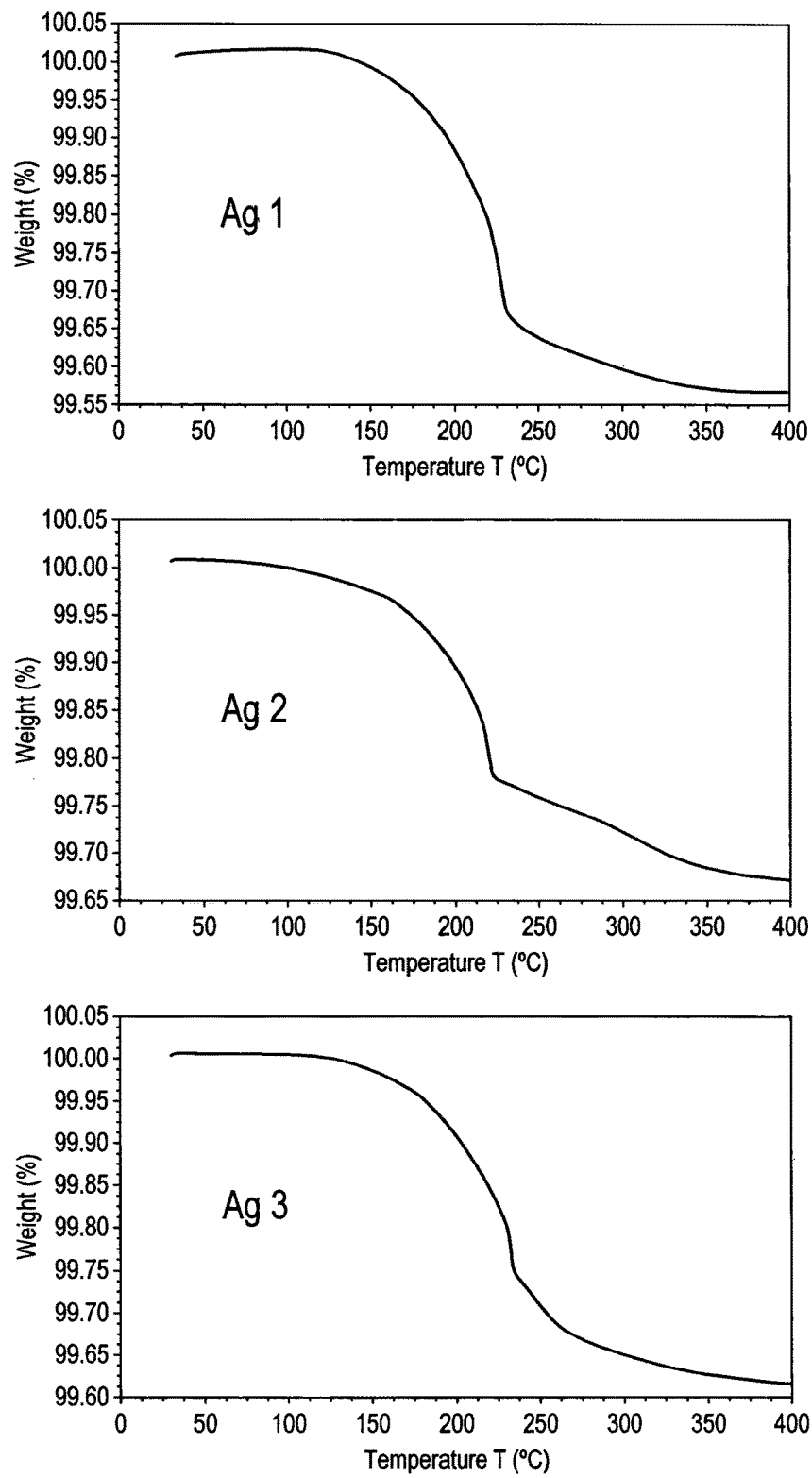
FIG. 3 shows thermogravimetric analysis (TGA) graphs of Ag particles of type Ag1-3.
Figure 4:
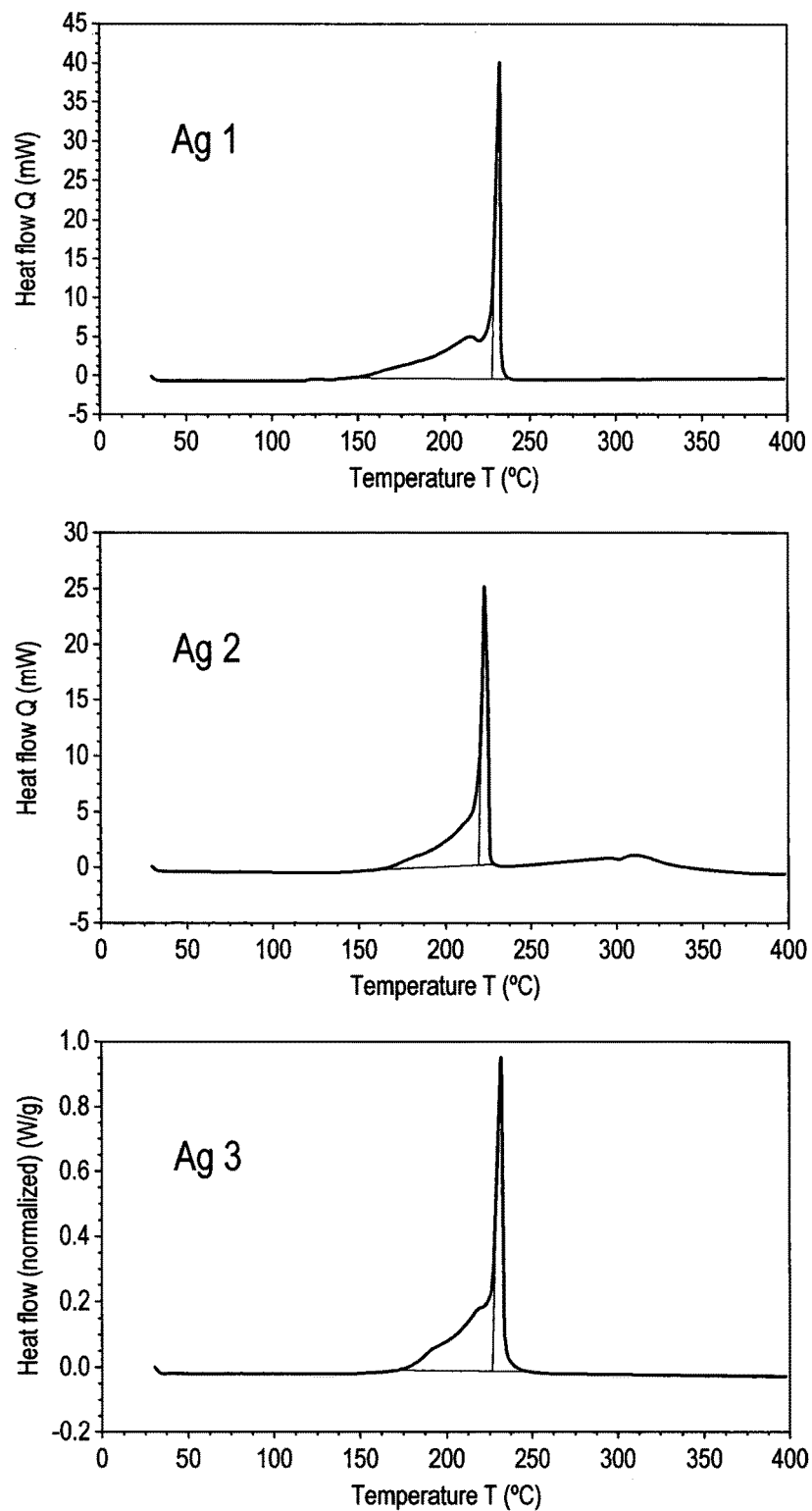
FIG. 4 shows differential scanning calorimetric (DSC) graphs of Ag particles of type Ag1-3.
Figure 5:
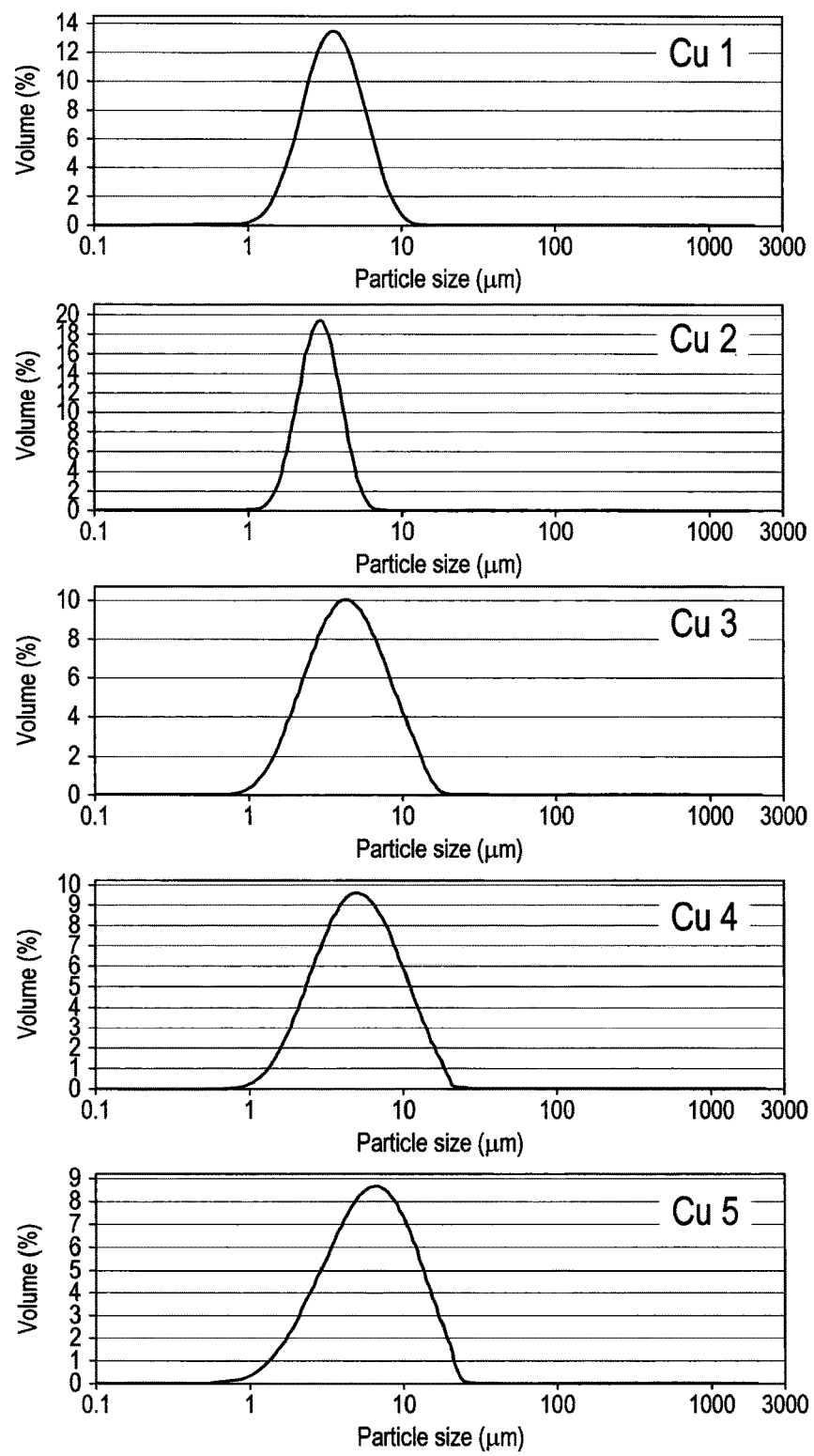
FIG. 5 shows particle size distribution (PSD) graphs of Cu particles of type Cu1-5.
Figure 6:
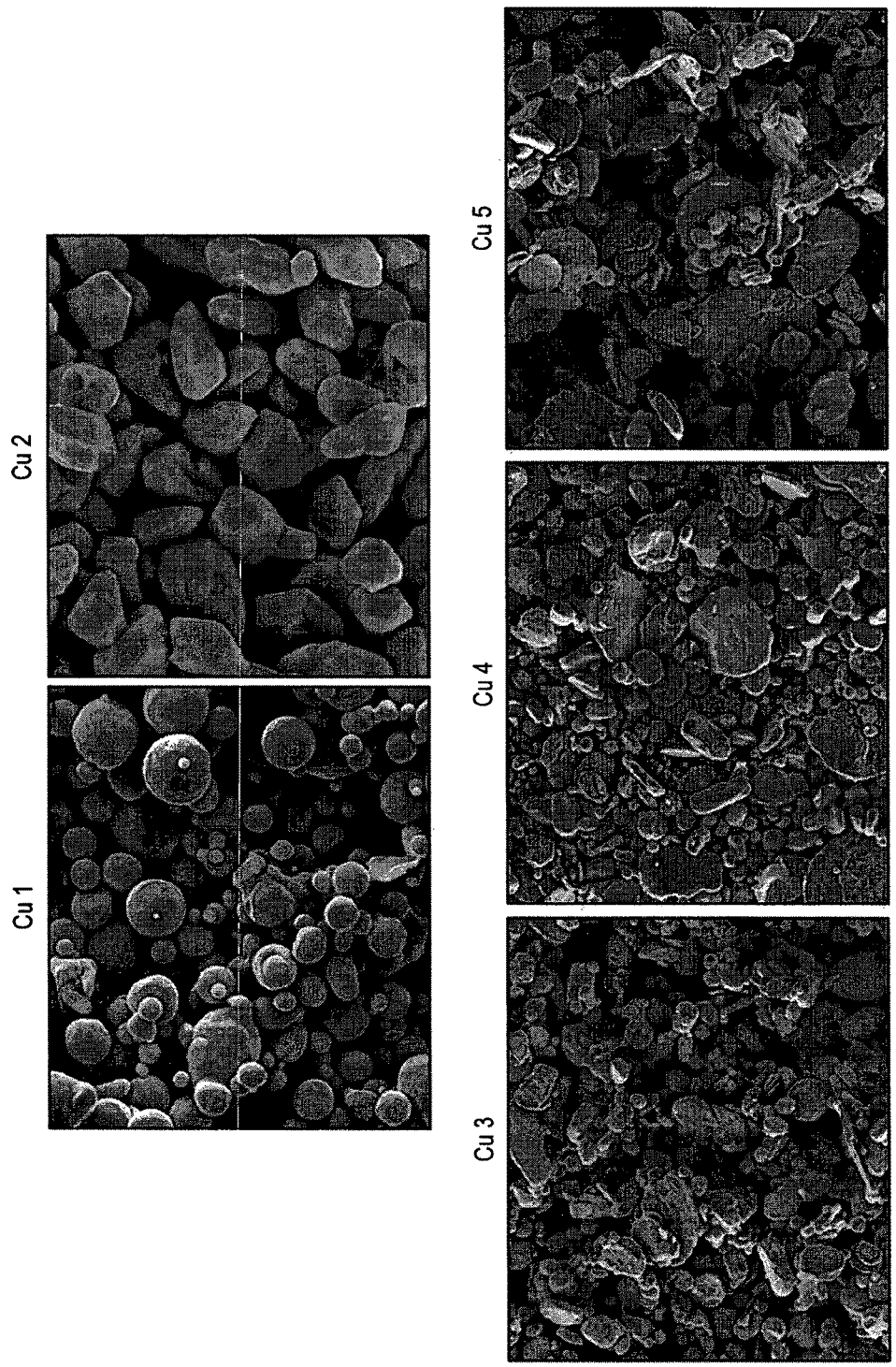
FIG. 6 shows scanning electron micrographs (SEM) of Cu particles of type Cu1-5.
Figure 7:
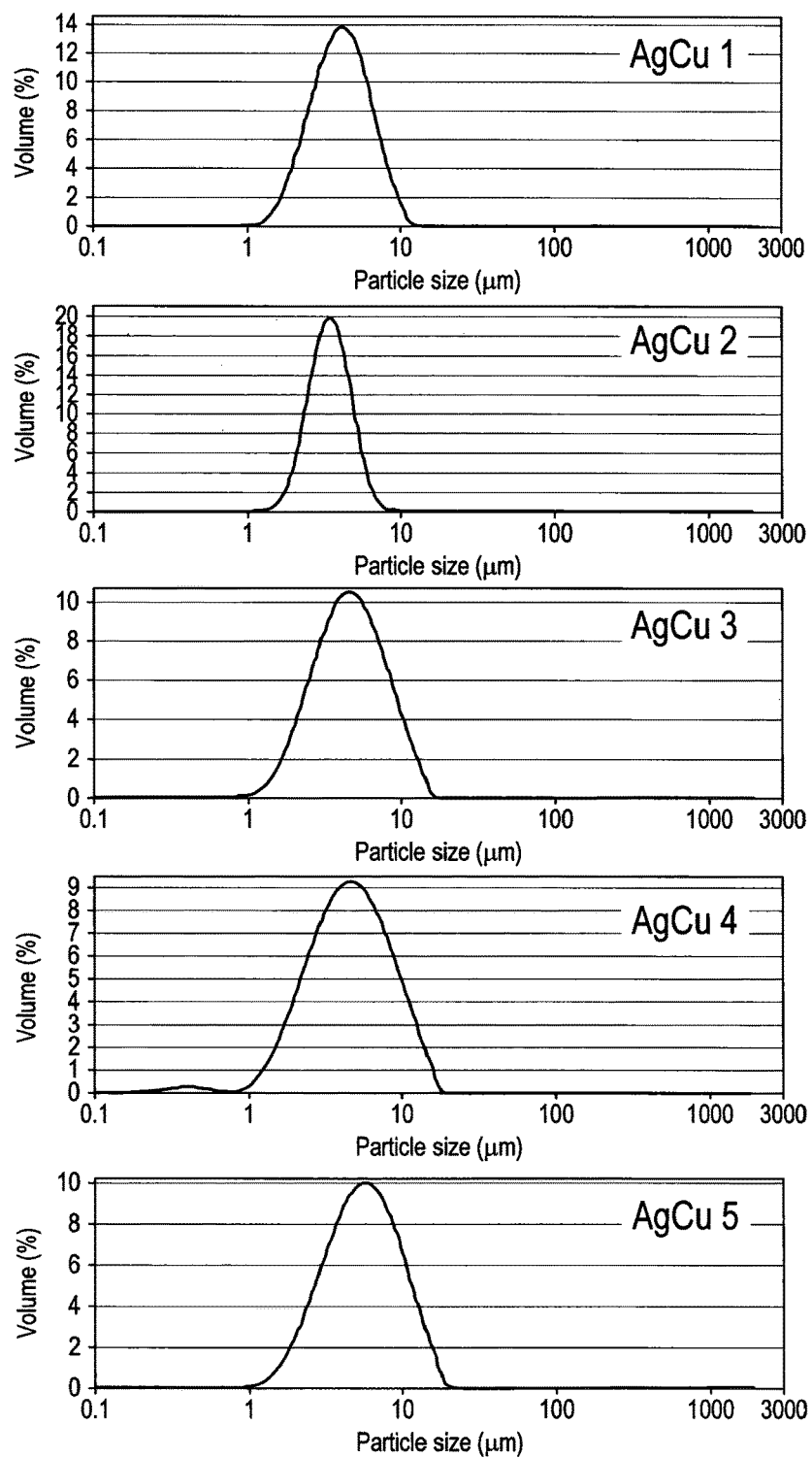
FIG. 7 shows particle size distribution (PSD) graphs of Ag coated Cu particles of type AgCu1-5.
Figure 8:
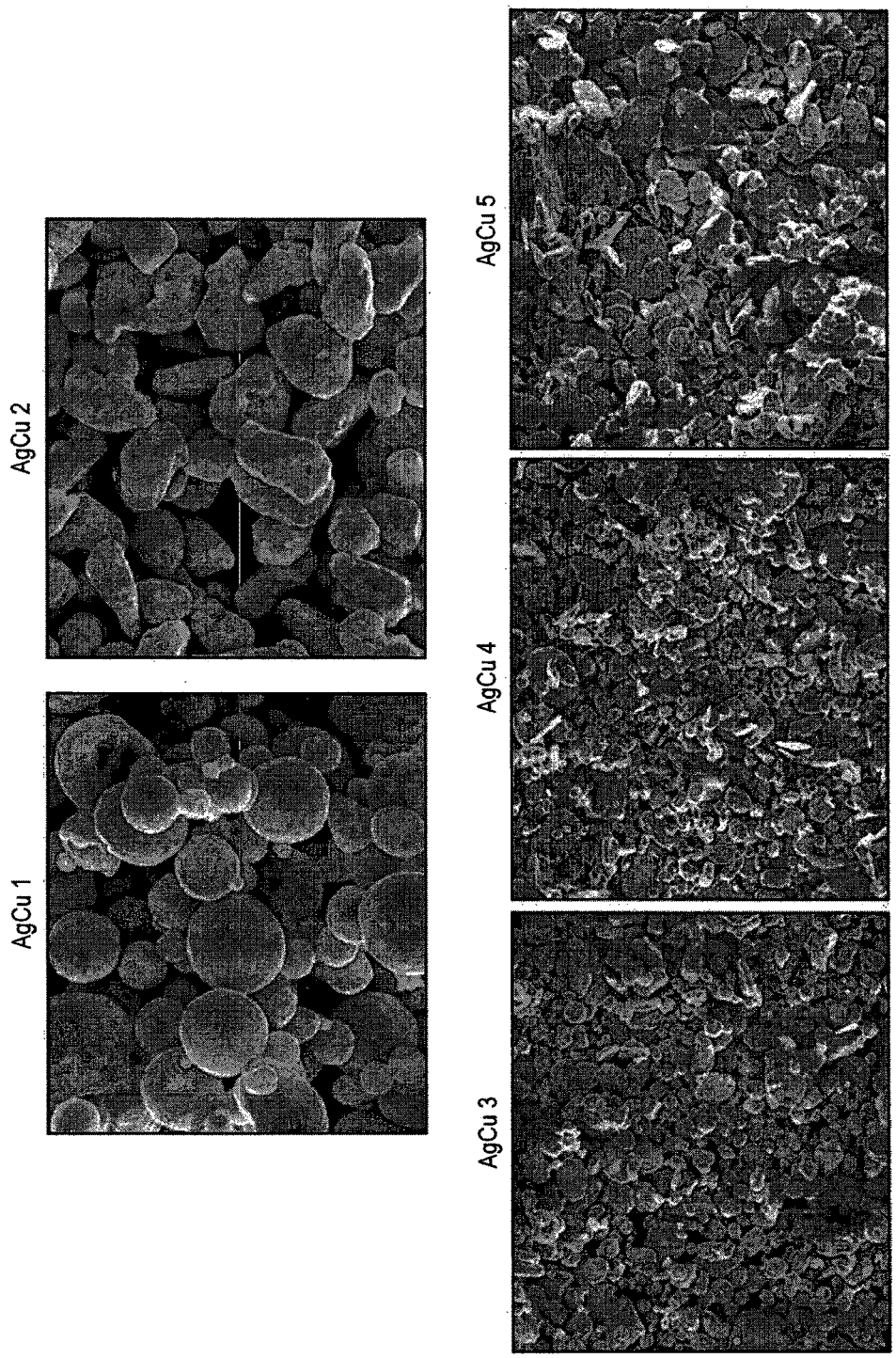
FIG. 8 shows scanning electron micrographs (SEM) of Ag coated silver particles of type AgCu1-5.

The invention will now be described with reference to the following non-limiting Examples.

EXAMPLE 1—AG MICRON PARTICLES TYPE-1

In the chemical process, 420 g of silver nitrate was dissolved in 2100 g of deionised water by stirring. 420 g of DMF was added to it and stirred continuously. To this solution, two separate solutions, (1) a mixture of 325 g of triethylamine and 460 g of formaldehyde and (2) a solution of 30 g of sodium hydroxide in 200 g deionised, were added simultaneously. This was immediately followed by the addition of freshly prepared sodium oleate solution (6.3 g oleic acid added to a solution of 1.3 g of sodium hydroxide in 200 g water). The mixture was allowed to stir for 1 hour, after which the powder was filtered, washed with water and acetone, till the pH of the filtrate was neutral. The powder was then dried in an oven at 70° C. for 8 h.

This is followed by a mechanical process, in which 200 g of dried powder was stirred in a solution of 250 g of toluene and 4 g of oleic acid for 30 min, which was then mechanically processed using an attritor ball mill for 4.5 h, using zirconia beads of size 0.1 mm. This was then washed with acetone to separate the beads from the powder and allowed to settle. The powder was collected by decanting the solvent. This was washed with acetone to remove the extra organic. The powder was then dried in an oven at 70° C. for 8 h.

EXAMPLES 2 AND 3—AG MICRON PARTICLES TYPE-2 AND 3

In the chemical process, 420 g of silver nitrate was dissolved in 1500 g of deionised water by stirring. A solution of 89 g of sodium hydroxide in 400 g of deionised water added to it, which resulted in a brown heterogeneous solution. To the reaction mixture, a solution of 126 g of hydrazine hydrate in 1890 g of deionised water was added, which was followed by the addition of freshly prepared sodium oleate solution (6.3 g oleic acid added to a solution of 1.3 g of sodium hydroxide in 210 g water). The mixture was allowed to stir for 1 h, after which the powder was filtered, washed with water and acetone, till the pH of the filtrate was neutral. The powder was then dried in an oven at 70° C. for 8 h.

This is followed by a mechanical process, in which 200 g of dried powder was stirred in a solution of 200 g of toluene and 4 g of oleic acid for 30 min, which was then mechanically processed using an attritor ball mill, using zirconia beads of size 0.1 mm for (a) 4.5 h, to produce Ag-micron particle-type-2 or (b) 9 h, to produce Ag-micron particle type-3. This was then washed with acetone to separate the beads from the powder and allowed to settle. The powder was collected by decanting the solvent. This was washed with acetone to remove the extra organic. The powder was then dried in an oven at 70° C. for 8 h.

EXAMPLE 4—A PREPARATION OF FACETED COPPER MICRON PARTICLES TYPE CU 2

1140 g of copper (II) nitrate trihydrate was dissolved in 1550 g of deionised water containing 6.9 g of a surfactant (DAXAD), by stirring for 30 min. The reaction mixture was kept on a hot plate with an electronic thermometer. 1380 mL of 30% ammonia solution was added to the above solution till pH became 8. The solution was stirred for 10 min. The temperature was set at 70° C. After attaining the desired temperature, 1970 mL of 60% Hydrazine Hydrate was added at a rate of 30 mL per minute and stirred continuously for 30 min. To reduce effervescence, minimum amount of ethanol was added at intervals. The temp was set at 85° C. After attaining the temperature, the solution was stirred for 2.5 h. The powder was allowed to settle down and collected by decanting the supernatant. It was washed with water and acetone and oven dried in forming gas (90-95% nitrogen: 5-10% hydrogen) environment at 50° C. for 8 h.

EXAMPLE 5-7—PREPARATION OF FLAKE SHAPED COPPER MICRON PARTICLES TYPE CU 3-5

500 g of finely crushed copper powder (Cu 1) was added to a solution of 300 g distilled water, 25 g PEG 400, 2.25 g triethylenetetramine. This was mixed well to get a homogenous mixture and was entirely transferred into an attritor Ball mill having 2.2 Kg of zirconia beads of size 1.6 mm. The milling was continued for (a) 45 min, for obtaining Cu 3, (b) 1 h, for obtaining Cu 4 and (c) 2 h, for obtaining Cu 5. After the mechanical process, the mixture along with the beads was taken into a beaker to separate the copper flake from the beads using water. It was washed with water and acetone mixture till the blue color supernatant disappears and then washed with acetone. The copper flake was dried at 50° C. in a forming gas (90-95% nitrogen:5-10% hydrogen) environment in order to avoid its oxidation.

EXAMPLE 8—SPHERICAL AGCU: TYPE AGCU 1

Ag coating process: 1 Kg of finely crushed commercial copper powder (Cu 1) was added to 2 Kg of deionised water. To it, 50 g of PEG-400 was added and the mixture was stirred well for 10 min, to obtain a homogenous form. The above slurry was added to 3 L of triethylenetetramine with constant stirring. This mixture was stirred for 1.5 h. 10 Kg of ice cold water was added to the reactor. This was then stirred for another 15 min. 220 g of silver nitrate and 660 g of citric acid were dissolved in 5 Kg of distilled water and added to the above reaction mixture slowly (in ~20 min) with constant stirring. After complete addition, the reaction mixture was further stirred for 1 h. After the completion of the reaction, the mixture was allowed to settle down, the supernatant blue solution was decanted and settled AgCu was washed with water till the supernatant was completely colorless, followed by washing with acetone. The powder was dried in an oven at 50-60° C.

Organic coating Process: Coating solution is composed of 140 g isostearic acid in 2600 g toluene. The dried AgCu powder was added to this solution and stirred for 1 h. The mixture was allowed to settle down; the supernatant sea-green color solution was poured off. The AgCu powder was washed with acetone till colorless solution was obtained. The powder was dried in an oven at 50-60° C.

EXAMPLE 9—FACETED AGCU: TYPE AGCU 2

Ag coating process: 100 g of faceted copper powder (Cu 2) was taken in 350 g of water and stirred well for proper dispersion. To it, a mixture of 350 g of water, 22.75 g of ammonium sulphate and 20 mL ammonium hydroxide were added and stirred for 15 min. The supernatant was decanted, and a mixture of 5 g PEG, 350 g water and 350 g triethyltetraamine were immediately added to it, and stirred for 1.5 h. 1 Kg water was added to it, followed by dropwise addition of a solution of 26.4 g AgNO₃ and 22 g citric acid in 250 g water and stirred for 1 h. The powder was washed with acetone till colorless solution was obtained. The powder was dried in an oven at 50-60° C.

Organic coating Process: The powder was taken in a 500 mL beaker, 300 g 5% solution of isostearic acid (285 g Toluene and 15 g isostearic acid) was added to it and stirred for 1 h. The coated powder was washed with acetone and oven dried at 50-60° C.

EXAMPLE 10-12—FLAKE SHAPED AGCU: TYPE AGCU 3-5

Ag and organic coating process: Flake shaped copper particles Cu 3-5 were used for preparing flake shaped AgCu particles. The Ag coating and organic coating process are same as described for spherical AgCu 1.

The silver, copper and silver coated copper micron particles of Examples 1-12 were characterized using SEM, PSD, elemental analysis, BET, Tap density and thermal analysis (TGA and DSC) and are summarized in Table 1 (Ag micron particles), Table 2 (Copper micron particles) and Table 3 (Ag coated copper micron particles).

Other applications of the metal powders, sintering films and sintering pastes of the present invention are as follows:

1. Wafer-to-wafer bonding layers for Vertical LED Designs, Thin Film Flip Chip Designs and Red LED Designs, based on both printable pastes and films. There is a significant need for wafer-to-wafer bonding at low temperatures (under 250° C. and also under 200° C.) where the bonding layer exhibits very high temperature properties post bonding. In the case of LED wafer bonding, this can be accomplished for example, in the context of either thin film flip chip or vertical thin film or truncated inverted pyramid LEDs, where CTE mismatch and therefore strain and defect generation can be minimized, while allowing for high temperature post processing with a variety of advanced materials for enhancing light output and electrical efficiency of the device. Further, the high temperature and high thermal and electrical conductivities of the bonding layer allow for superior thermal transfer, high temperature operation of the device and superior current spreading, among other advantages. Such wafer bonding can be accomplished by lamination of films of the said material on the backside of the wafers, followed by temperature and pressure processing in a standard wafer bonder or a press. Another means of doing

TABLE 1

Characterization Data of Silver Micron Particles Ag Type 1-3.

| SAMPLE NAME | Milling Time (min) | PSA (μm) | | | % Organics (TGA) | Organic Desorption Peak (DSC) | BET (m²/g) | TAP DENSITY (g/m) |
|---|---|---|---|---|---|---|---|---|
| | | D (0.1) | D (0.5) | D (0.9) | | | | |
| Ag-1 | 270 | 0.53 | 1.1 | 4.1 | 0.47 | 239 | 1.27 | 4.5 |
| Ag-2 | 270 | 0.69 | 1.7 | 5.2 | 0.37 | 225 | 0.74 | 5.1 |
| Ag-3 | 540 | 0.74 | 1.7 | 4.8 | 0.35 | 232 | 0.78 | 5.2 |

TABLE 2

Characterization Data of Copper Micron Particles Cu Type 1-5.

| SAMPLE NAME | Milling Time | Average Shape | PSA (μm) | | | Organic % (Elemental Analysis) | BET (m²/g) | TAP DENSITY (g/ml) |
|---|---|---|---|---|---|---|---|---|
| | | | D (0.1) | D (0.5) | D (0.9) | | | |
| Commercial Copper Powder Cu 1 | NA | Spherical | 1.7 | 3.6 | 7.0 | 0.001 | 0.4 | 5.22 |
| Cu-2 | 0 | Faceted | 1.8 | 2.9 | 4.5 | 0.18 | 0.59 | 4.4 |
| Cu-3 | 45 | Flake | 2.1 | 4.7 | 10.3 | 0.013 | 0.55 | 4.4 |
| Cu-4 | 60 | Flake | 2.1 | 4.7 | 10.3 | 0.02 | 0.73 | 4.2 |
| Cu-5 | 120 | Flake | 2.4 | 5.7 | 12.5 | 0.03 | 0.98 | 3.7 |

TABLE 3

Characterization Data of Silver coated Copper Micron Particles AgCu Type 1-5.

| SAMPLE NAME | Milling Time | Average Shape | PSA (μm) | | | Organic % (Elemental Analysis) | BET (m²/g) | TAP DENSITY (g/ml) | Ag % (ICP) |
|---|---|---|---|---|---|---|---|---|---|
| | | | D (0.1) | D (0.5) | D (0.9) | | | | |
| AgCu-1 | 0 | Spherical | 2.1 | 3.9 | 6.9 | 0.06 | 0.34 | 4.5 | 13.9 |
| AgCu-2 | 0 | Faceted | 2.1 | 3.2 | 4.8 | 0.28 | 0.5 | 2.9 | 19.2 |
| AgCu-3 | 45 min | Flake | 2.1 | 4.5 | 9.3 | 0.08 | 0.47 | 4.2 | 12.4 |
| AgCu-4 | 60 min | Flake | 2.1 | 4.7 | 9.9 | 0.08 | 0.52 | 4.1 | 13.3 |
| AgCu-5 | 120 min | Flake | 2.7 | 5.4 | 11 | 0.09 | 0.65 | 3 | 12.6 | the processing includes printing a conformal layer of paste on the wafer backside, followed by drying and bonding in a standard wafer bonder or press, under temperature and pressure conditions. Other applications for such wafer bonding include power semiconductor wafers, Through Silicon Via (TSV) applications, stacked die applications, MEMS, concentrated photovoltaic and other applications. Low temperature sintering enables assembly of high CTE mismatch stacks as well as temperature sensitive material stacks, thermoelectric materials and piezoelectric materials.

2. Attachment of semiconductor die (either flip chip or wire bonded), onto a variety of substrates such as DBC (Direct Bond Copper), DPC (Direct Plate Copper), MCPCB (Metal Core PCBs), FR4, Copper lead-frames, Flexible PCBs and substrates, Copper and Aluminum Heat-Sinks, Fixtures, etc.). Applications include LED die (light emitting diodes for example of the lateral, vertical thin film or flip chip varieties) made from various compound semiconductor materials, power die made from silicon, concentrated photovoltaic compound semiconductor cells (e.g. multi-junction cells) silicon carbide and gallium nitride used in power modules, and discrete devices, MEMS (microelectromechanical sensor) devices of all types, semiconductor and stacked die and other applications such as thermoelectric materials and piezoelectric materials.

(a) The attachment of such semiconductor or other die elements can be accomplished by printing on to the substrates, followed by die placement via a die bonder or a pick and place machine, and sintering in either a reflow oven belt or box oven. Attachment of such semiconductor and die elements can also be accomplished via dispensing the paste, followed by die placement and sintering as outlined above, or doing film transfer and lamination on the die backside of the film made from the said material, followed by die placement and tacking onto the substrate, followed by sintering. Flip chip die can be assembled by printing bumps on the substrate, placing the die, followed by sintering. Low temperature sintering enables assembly of high CTE mismatch stacks as well as temperature sensitive material stacks.

3. Attachment of semiconductor packages of various types (for example bottom termination components such as LGAs, QFNs, QFPs, etc.), onto a variety of substrates such as DBC (Direct Bond Copper), DPC (Direct Plate Copper), MCPCB (Metal Core PCBs), FR4, Flexible PCBs and substrates, Copper and Aluminum Heat-Sinks, Fixtures, etc.). Applications include LED packages of various types (for example, ceramic sub-mount LEDs, SMD LEDs with lead-frame construction, etc,) power modules, and discrete devices, MEMS (microelectromechanical sensor) packages of all types, semiconductor and stacked die packages and other applications.

(a) The attachment of such semiconductor or other packages can be accomplished by printing on to the substrates, followed by package placement via standard pick and place machine with Z Height adjustment and/or pressure capability, and sintering in either a reflow oven belt oven or box oven. Low temperature sintering enables assembly of high CTE mismatch stacks as well as temperature sensitive material stacks.

4. Production of interconnect lines ('circuitry, pads, etc.) separately and along with flip chip interconnects. For example, applications for interconnect lines include LED boards and luminaires, where the interconnect lines can be applied by a variety of printing (e.g. stencil printing) or dispensing or jetting techniques. In the case of LED applications, such interconnects can serve as both electrical and thermal conductors to carry the electrons to and from the device, and the heat away from the device. Further, such interconnect lines can be directly applied in the same step with interconnects for attaching flip chip or wire bonded devices. Another example of such interconnects is solar cells (either silicon based or thin film based), where the interconnects in a grid pattern could be used to collect electrons generated, and also connect one cell to another.

5. Reflective layer printing for LED and optical applications. The said material can be used to print reflective layers on to substrates such as DBC (Direct Bond Copper), DPC (Direct Plate Copper), MCPCB (Metal Core PCBs), FR4, Flexible PCBs and substrates, Copper and Aluminum Heat-Sinks, Fixtures, etc.), in order to provide light output enhancement and therefore luminous efficacy enhancement of LED and other optical systems. Such reflective layers can be formed via stencil or screen printing, jetting or dispensing or film lamination of the said material.

6. Hermetic and near hermetic sealing for packages, perimeter seals, etc. for LED, MEMS, OLED and PV applications and general semiconductor packaging. There is a significant need for hermetic sealing of LED, OLED, MEMS and thin film PV packages, to protect the devices from moisture ingress. The said material can exhibit hermetic or near hermetic sealing behavior with proper application and sintering. The said material can be applied in various stages of the manufacturing processes for the above devices: Either at the wafer level with wafer bonding, or in the packaging process via film lamination and bonding, or paste jetting/dispensing followed by lid or glass or laminate cover attach and sintering. Low temperature sintering enables assembly of high CTE mismatch stacks as well as temperature sensitive material stacks.

7. ACF Replacements. Arrays of bumps of the said material can be delivered to the substrate via stencil printing, bump transfer, or high speed jet dispensing. Such arrays can be used to serve as electrical contacts to assemble devices without explicit high degrees of alignment

The invention claimed is:

1. A method for manufacturing silver powder comprising: providing a basic silver salt solution;
contacting the basic silver salt solution, the basic silver salt solution comprising a silver salt and a solvent, with a reducing agent comprising one or more of hydrazine, formaldehyde and borohydride to precipitate silver powder therefrom;
contacting the basic silver salt solution with a first capping agent after contacting the basic silver salt solution with the reducing agent; and recovering precipitated silver powder from the solvent;
and milling the recovered precipitated silver powder for at least 30 minutes in the presence of a second capping agent using a ball mill,
wherein the silver powder has a d50 of from 500 nm to 10 µm, and a tap density of greater than 2 g/cm$^3$, wherein the first capping agent comprises one or more of lauric acid, palmitic acid, stearic acid, iso-stearic acid and oleic acid.

2. The method of claim 1, wherein the reducing agent comprises hydrazine and borohydride.

3. The method of claim 1, wherein the second capping agent comprises one or more of lauric acid, palmitic acid, stearic acid, iso-stearic acid, and oleic acid.

4. The method of claim 1, wherein the milling is carried out for at least 90 minutes.

5. The method of claim 1, further comprising the step of combining the silver powder with a binder and a solvent, and optionally one or more of a rheology modifier, an organosilver compound, an activator, and a peroxide.

6. The method of claim 1, wherein the second capping agent comprises a polymer, said polymer comprising PEG 400.

7. The method of claim 1, wherein the second capping agent comprises a polyamine, said polyamine comprising triethylenetetramine.

8. A method of manufacturing a copper powder comprising: providing a basic copper salt solution, the basic copper salt solution comprising a copper salt and a solvent; contacting the basic copper salt solution with a reducing agent comprising one or more of hydrazine, formaldehyde, and borohydride to precipitate copper powder therefrom; contacting the basic copper salt solution with a capping agent after contacting the basic copper salt solution with the reducing agent; recovering precipitated copper powder from the solvent; and milling the recovered precipitated copper powder for at least 30 minutes in the presence of a polymer or a polvamine using a ball mill, wherein the copper powder has a d50 of from 500 nm to 10 μm, and a tap density of greater than 2 g/cm$^3$.

9. The method of claim 8, further comprising the step of applying a silver coating to the copper particles forming the powder.

10. The method of claim 8, wherein the milling is carried out for at least 90 minutes.

11. The method of claim 9, wherein applying the silver coating comprises:
    etching an oxide layer from the copper particles; and
    applying a silver coating to the copper particles using galvanic plating.

12. The method of claim 9, further comprising applying a fatty acid coating to the silver coated particles.

* * * * *